(12) United States Patent
Choi et al.

(10) Patent No.: US 11,977,332 B2
(45) Date of Patent: May 7, 2024

(54) SUBSTRATE TREATING APPARATUS AND SUBSTRATE TREATING METHOD

(71) Applicants: SEMES CO., LTD., Cheonan-si (KR); RESEARCH & BUSINESS FOUNDATION SUNGKYUNKWAN UNIVERSITY, Gyeonggi-do (KR)

(72) Inventors: Hae-Won Choi, Daejeon (KR); Yerim Yeon, Hwaseong-si (KR); Anton Koriakin, Cheonan-si (KR); Kihoon Choi, Cheonan-si (KR); Youngran Ko, Daegu (KR); Jeong Ho Cho, Seoul (KR); Hyungseok Kang, Suwon-si (KR); Hong Gi Min, Seoul (KR)

(73) Assignees: SEMES CO., LTD., Chungcheongnam-do (KR); Research & Business Foundation SUNGKYUNKWAN UNIVERSITY, Gyeonggi-do (KR)

( * ) Notice: Subject to any disclaimer, the term of this patent is extended or adjusted under 35 U.S.C. 154(b) by 863 days.

(21) Appl. No.: 17/017,786

(22) Filed: Sep. 11, 2020

(65) Prior Publication Data
US 2021/0072644 A1    Mar. 11, 2021

(30) Foreign Application Priority Data
Sep. 11, 2019   (KR) .......................... 10-2019-0112630

(51) Int. Cl.
*G03F 7/16*   (2006.01)
*G03F 7/039*  (2006.01)
(Continued)

(52) U.S. Cl.
CPC .............. *G03F 7/162* (2013.01); *G03F 7/168* (2013.01); *H01L 21/67225* (2013.01); *G03F 7/039* (2013.01); *G03F 7/322* (2013.01)

(58) Field of Classification Search
CPC .............. G01C 21/206; G08B 21/0225; G08B 21/0277; G08B 21/0288; G08B 5/36;
(Continued)

(56) References Cited

U.S. PATENT DOCUMENTS

| 10,682,674 B2 * | 6/2020 | Jung ................... H01L 21/6715 |
| 2010/0135937 A1 * | 6/2010 | O'Brien .................. C01B 13/32 257/532 |

(Continued)

FOREIGN PATENT DOCUMENTS

| JP | H11352700 A | 12/1999 |
| JP | 2007322618 A | 12/2007 |

(Continued)

OTHER PUBLICATIONS

Office Action for Korean Application No. 10-2019-0112630 dated Dec. 5, 2020.

*Primary Examiner* — Deoram Persaud

(74) *Attorney, Agent, or Firm* — Harness, Dickey & Pierce, P.L.C.

(57) ABSTRACT

A substrate treating apparatus and a substrate treating method are provided. The substrate treating apparatus includes a first process chamber to apply an organic solvent to a substrate applied with a developer and introduced, and (Continued)

a second process chamber to treat the substrate applied with the organic solvent and introduced, through a supercritical fluid.

14 Claims, 5 Drawing Sheets

(51) Int. Cl.
    *G03F 7/32*     (2006.01)
    *H01L 21/67*     (2006.01)

(58) Field of Classification Search
    CPC .......... G08B 6/00; H04W 4/02; H04W 88/02;
        G03F 7/039; G03F 7/162; G03F 7/168;
        G03F 7/322; G03F 7/0392; G03F 7/30;
        G03F 7/32; G03F 7/325; G03F 7/40;
        G03F 7/422; G03F 7/423; H01L 21/6715;
        H01L 21/67225; H01L 21/02057; H01L
        21/02101; H01L 21/02307; H01L
        21/67017; B66F 17/003; E02F 9/24;
        C11D 1/667; C11D 11/0047; H02J
        7/0013; H02J 7/0042
See application file for complete search history.

(56) References Cited

U.S. PATENT DOCUMENTS

| | | | |
|---|---|---|---|
| 2012/0015857 A1* | 1/2012 | Chen | G03F 7/70341 510/170 |
| 2016/0045495 A1* | 2/2016 | Cresswell | A61K 31/496 514/253.07 |
| 2018/0093306 A1* | 4/2018 | Kang | H01L 21/67051 |
| 2018/0373154 A1* | 12/2018 | Choi | H01L 21/0274 |
| 2019/0011835 A1* | 1/2019 | Yonekuta | G03F 7/2006 |
| 2020/0026194 A1* | 1/2020 | Choi | G03F 7/325 |
| 2021/0166939 A1* | 6/2021 | Choi | G03F 7/40 |

FOREIGN PATENT DOCUMENTS

| | | |
|---|---|---|
| KR | 10-2007-0120884 A | 12/2007 |
| KR | 2015-0038564 A | 4/2015 |
| KR | 101552667 B1 | 9/2015 |
| KR | 101579507 B1 | 12/2015 |
| KR | 2018-0045588 A | 5/2018 |

\* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2019-0112630 filed on Sep. 11, 2019, in the Korean Intellectual Property Office, the entire contents of which are hereby incorporated by reference.

BACKGROUND

Embodiments of the inventive concept described herein relate to a substrate treating apparatus and a substrate treating method.

To fabricate a semiconductor device and a liquid crystal display panel, various processes, such as photolithography, etching, ashing, ion implanting, thin film deposition, and cleaning processes have been performed. Among them, the photolithography process, which is to form a desired circuit pattern on a substrate, includes coating, exposure, and developing processes which are sequentially performed. A photosensitive liquid, such as photoresist, is coated on the substrate in the coating process, a circuit pattern is exposed onto the substrate having a photoresist film formed thereon in the exposing process, and an area exposed is selectively developed on the substrate in the developing process. Thereafter, the substrate is dried after a developer used in the developing process is removed from the substrate.

SUMMARY

Embodiments of the inventive concept provide a substrate treating apparatus and a substrate treating method, capable of effectively processing a substrate.

Embodiments of the inventive concept provide a substrate treating apparatus and a substrate treating method, capable of preventing a pattern from being damaged in the process of treating a substrate coated with a developer.

The objects which will be achieved in the inventive concept are not limited to the above, but other objects, which are not mentioned, will be apparently understood to those skilled in the art.

Embodiments of the inventive concept provide a substrate treating apparatus. According to an exemplary embodiment, the substrate treating apparatus includes a first process chamber to apply an organic solvent to a substrate applied with a developer and introduced, and a second process chamber to treat the substrate applied with the organic solvent and introduced, through a supercritical fluid.

According to an exemplary embodiment, a first process fluid, which is pure water, may be applied to the substrate before applying the organic solvent in the first process chamber.

According to an exemplary embodiment, the organic solvent may include a second process solvent applied to the substrate after applying the pure water, and a third process fluid applied to the substrate after applying the second process fluid.

According to an exemplary embodiment, the second process fluid and the third process fluid may be provided with hydrophobic organic solvents.

According to an exemplary embodiment, the second process fluid may further a surfactant.

According to an exemplary embodiment, the surfactant may be a nonionic surfactant.

According to an exemplary embodiment, the surfactant may have a Hydropilic-Lipophilic Balance in a range of 6 to 9.

According to an exemplary embodiment, the surfactant may include a sorbitan ester (Sorbitan Esters or Spans).

According to an exemplary embodiment, the sorbitan ester may be one of Sorbitan trioleate (Span 85), Sorbitan monooleate (Span 80), and Sorbitan monolaurate (Span 20).

According to an exemplary embodiment, the sorbitan ester may have tails more than tails of Sorbitan monolaurate (Span 20) or have a tail having a length longer than a length of a tail of the sorbitan monolaurate (Span 20).

According to an exemplary embodiment, the developer may be used to develop a photoresist liquid.

The inventive concept provides a method (substrate treating method) for treating a substrate. According to an exemplary embodiment, the substrate treating method includes applying an organic solvent to a substrate applied with the developer and treating the substrate applied with the organic solvent through a supercritical fluid.

According to an exemplary embodiment, the method may further include applying pure water to the substrate before applying the organic solvent.

According to an exemplary embodiment, the applying of the organic solvent may include supplying a mixture of a hydrophobic organic solvent and a surfactant to the substrate applied with the developer, and supplying the hydrophobic organic solvent to the substrate.

According to an exemplary embodiment, the surfactant may be a nonionic surfactant.

According to an exemplary embodiment, the surfactant may have a Hydropilic-Lipophilic Balance in a range of 6 to 9.

According to an exemplary embodiment, the surfactant may be a sorbitan ester.

According to an exemplary embodiment, the sorbitan ester may be any one of Sorbitan trioleate (Span 85), Sorbitan monooleate (Span 80), and Sorbitan monolaurate (Span 20).

According to an exemplary embodiment, the sorbitan ester may have tails more than tails of Sorbitan monolaurate (Span 20) or have a tail having a length longer than a length of a tail of the sorbitan monolaurate (Span 20).

According to an exemplary embodiment, the developer may be used to develop a photoresist liquid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
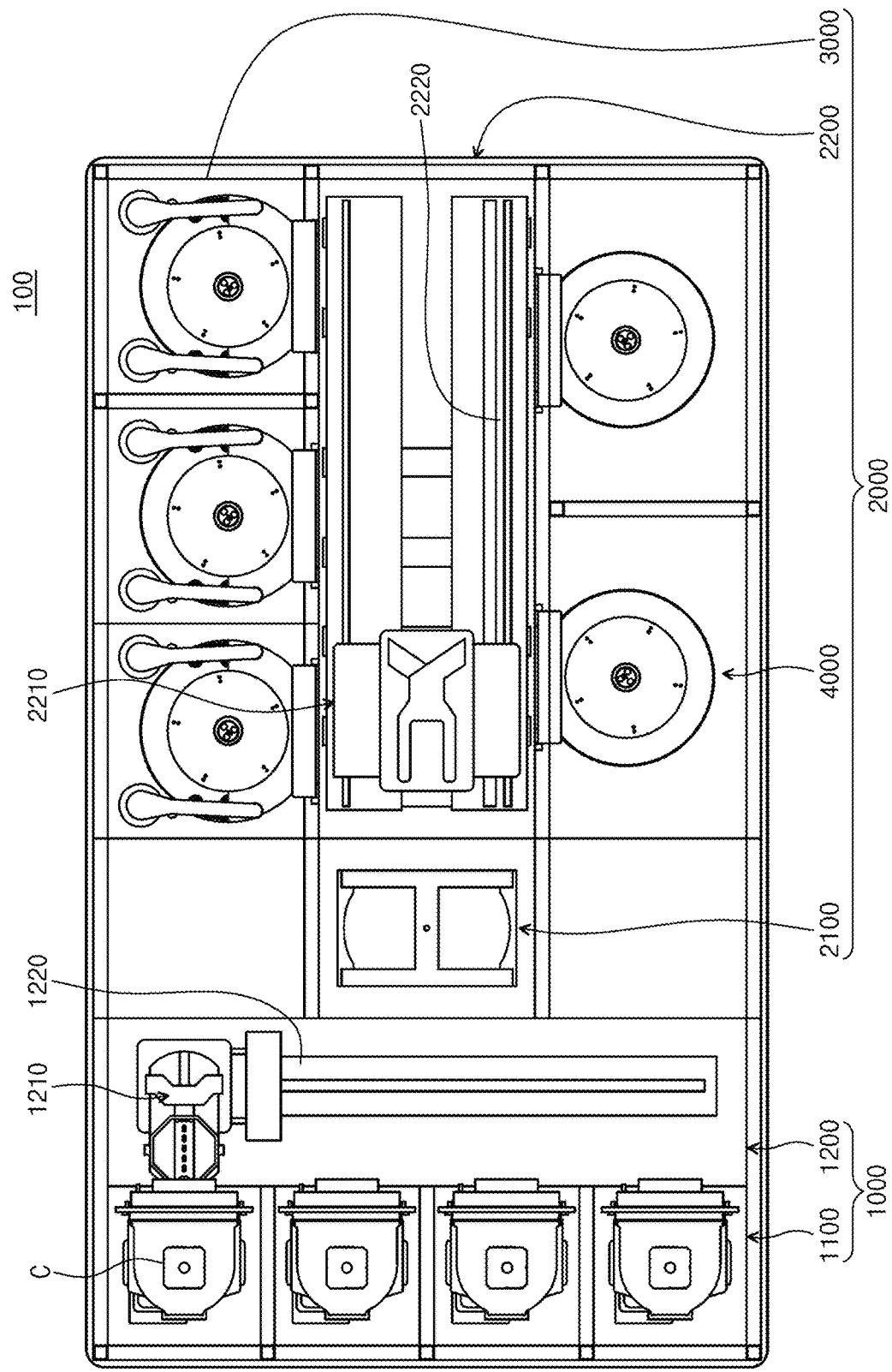
FIG. 1 is a plan view illustrating a substrate treating apparatus, according to an embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, an apparatus (substrate treating apparatus) for treating a substrate will be described according to one embodiment of the inventive concept.

The substrate treating apparatus may perform a supercritical process to treat a substrate using a supercritical fluid serving as a process fluid.

In this case, the substrate is a comprehensive concept including all substrates used to manufacture an article having a circuit pattern formed on a semiconductor device, a flat panel display (FPD), and other thin films. Such a substrate 'S' includes, for example, a silicon wafer, a glass substrate, and an organic substrate.

FIG. 1 is a plan view illustrating a substrate treating apparatus, according to an embodiment of the inventive concept.

Referring to FIG. 1, a substrate treating apparatus 100 may have an index module 1000 and a process module 2000.

The index module 1000 receives a substrate 'S' from an outside and carries the substrate 'S' to the process module 2000. The process module 2000 performs a substrate treating process using a supercritical fluid.

The index module 1000 includes a load port 1100 and a transfer frame 1200, as equipment front end modules (EFEM).

A container 'C' is placed in the load port 1100 to receive the substrate 'S'. A front opening unified pod (FOUP) may be used as the container 'C'. The container 'C' may be introduced into the load port 1100 from the outside or withdrawn to the outside from the load port 1100 through Overhead Transfer (OHT)

The transfer frame 1200 carries the substrate 'S' between the container 'C' placed in the load port 1100 and the process module 2000. The transfer frame 1200 includes an index robot 1210 and an index rail 1220. The index robot 1210 moves on the index rail 1220 and may carry the substrate 'S'.

The process module 2000 includes a buffer chamber 2100, a transfer chamber 2200, a first process chamber 3000, and a second process chamber 4000.

The buffer chamber 2100 provides a space to temporarily stay the substrate 'S' carried between the index module 1000 and the process module 2000. A buffer slot may be provided in the buffer chamber 2100. The substrate 'S' is placed in the buffer slot. For example, the index robot 1210 may withdraw the substrate 'S' from the container 'C' and place the substrate 'S' in the buffer slot. The transfer robot 2210 of the transfer chamber 2200 may withdraw the substrate 'S' from the buffer slot and may carry the substrate 'S' to the first process chamber 3000 or the second process chamber 4000.

A plurality of buffer slots may be provided in the buffer chamber 2100 to place a plurality of substrates 'S'.

The transfer chamber 2200 carries the substrate 'S' between any two among the buffer chamber 2100, the first process chambers 3000, and the second process chamber 4000 which are disposed around the transfer chamber 2200. The transfer chamber 2200 includes a transfer robot 2210 and a transfer rail 2220. The transfer robot 2210 may move on the transfer rail 2220 to carry the substrate 'S'.

The first process chamber 3000 and the second process chamber 4000 may perform a cleaning process using a process fluid. The cleaning process may be sequentially performed in the first process chamber 3000 and the second process chamber 4000. For example, the cleaning process may be performed in the first process chamber 3000 and a supercritical drying process may be performed in the second process chamber 4000. Alternatively, a cleaning process and a drying process may be performed in the second process chamber 4000.

The first process chamber 3000 and the second process chamber 4000 are disposed on side surfaces of the transfer chamber 2200. For example, the first process chamber 3000 and the second process chamber 4000 may be arranged to face each other on different side surfaces of the transfer chamber 2200.

A plurality of first process chambers 3000 and a plurality of second process chambers 4000 may be provided in the process module 2000. The plurality of process chambers 3000 and 4000 may be arranged in a line on the side surface of the transfer chamber 2200, may be stacked up and down, or may be arranged in the form of a combination thereof.

The arrangement of the first process chamber 3000 and the second process chamber 4000 is not limited to the above-described example, and may be changed in consideration of the footprint or process efficiency of the substrate processing apparatus 100. The substrate processing apparatus 100 may be controlled by a controller.

Figure 2:
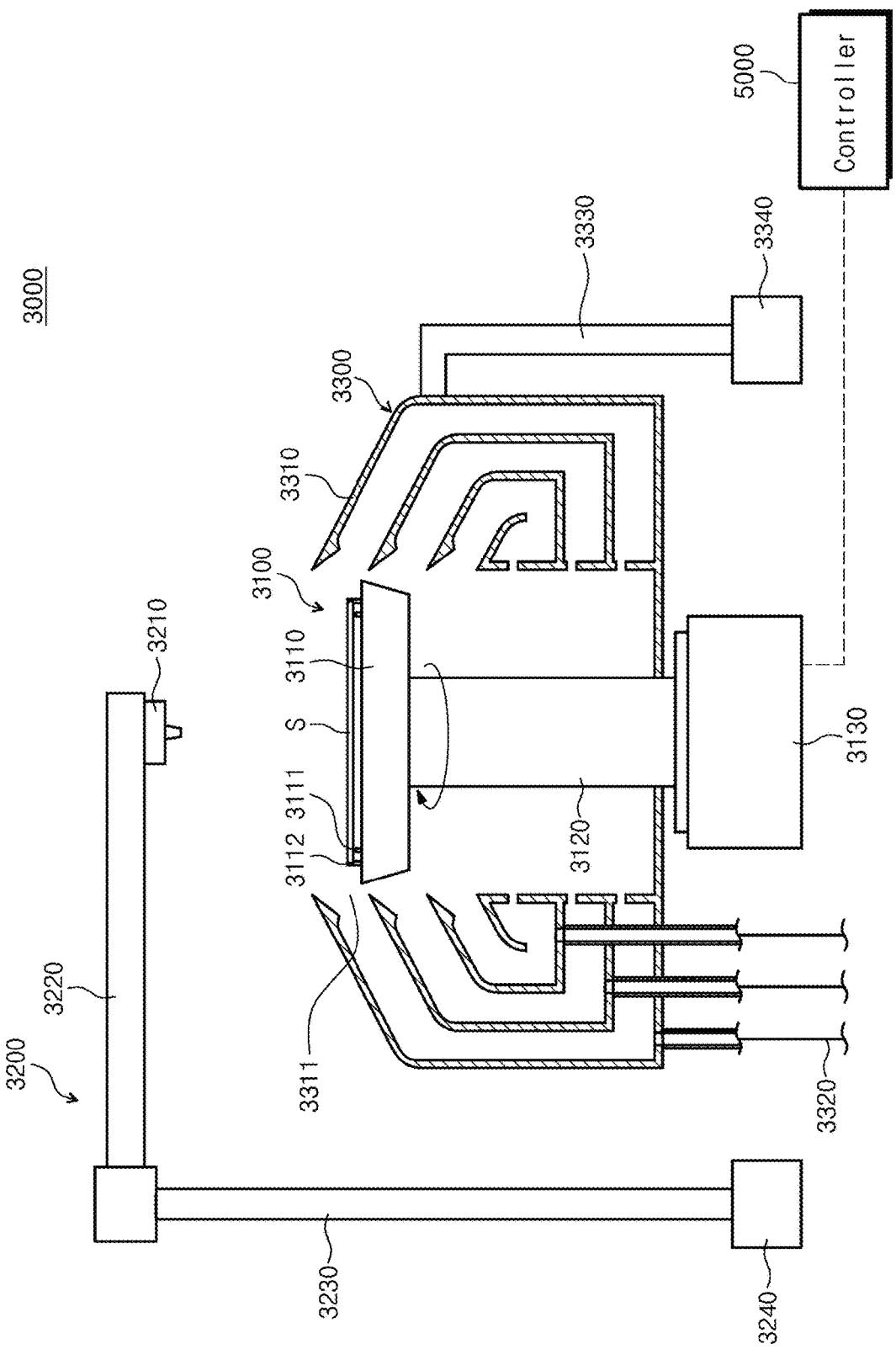
FIG. 2 is a sectional view illustrating a first process chamber of FIG. 1, according to an embodiment.

FIG. 2 is a sectional view illustrating the first process chamber of FIG. 1.

Referring to FIG. 2, the first process chamber 3000 includes a support unit 3100, a nozzle unit 3200, and a recovery unit 3300.

The first process chamber 3000 may clean the substrate using a composition (substrate cleaning composition) for cleaning a substrate. The process performed in the first process chamber 3000 is performed in the form of an anhydrous process that does not use water. Conventional chemical solutions, such as SC Standard Clean (SC)-1 and Dilute Hydrofluoric Acid (DHF), include water. A pattern formed on the substrate becomes gradually finer, and the line width of the pattern gradually becomes smaller. Water has a surface tension. Accordingly, since water has surface tension, water is less infiltrated into a narrow space between patterns, to represent the lower cleaning efficiency for the space between patterns. In addition, the chemical solution is substituted with deionized water in the cleaning process using a chemical solution, such as conventional SC-1 and DHF, and then a drying process is performed. In even the drying process, pattern leaning or pattern collapse may occur. To the contrary, according to the inventive concept, the substrate cleaning composition is provided not to contain water. Accordingly, the problem caused by water included in the conventional chemical solution does not occur.

The support unit 3100 supports the substrate 'S'. The support unit 3100 may rotate the supported substrate 'S'.

The support unit 3100 includes a support plate 3110, a support pin 3111, a chuck pin 3112, a rotating shaft 3120, and a rotating driver 3130.

The support plate 3110 has a top surface in the shape which is the same as or similar to that of the substrate 'S'. The support pin 3111 and the chuck pin 3112 are formed on the top surface of the support plate 3110. The support pin 3111 supports a bottom surface of the substrate 'S'. The chuck pin 3112 may fix the substrate 'S' supported.

The rotating shaft 3120 is connected to a lower portion of the support plate 3110. The rotating shaft 3120 receives the rotational force from the rotating driver 3130 to rotate the support plate 3110. Accordingly, the substrate 'S' seated on the support plate 3110 may rotate. The chuck pin 3112 prevents the substrate 'S' from deviating from a correct position.

The nozzle unit 3200 sprays the substrate cleaning composition onto the substrate 'S'. The nozzle unit 3200 includes a nozzle 3210, a nozzle bar 3220, a nozzle shaft 3230, and a nozzle shaft driver 3240.

The nozzle 3210 sprays the substrate cleaning composition on the substrate 'S' seated on the support plate 3110. The nozzle 3210 is formed on one bottom surface of the nozzle bar 3220. The nozzle bar 3220 is coupled to the nozzle shaft 3230. The nozzle shaft 3230 is provided to be lifted or rotated. The nozzle shaft driver 3240 may adjust the position of the nozzle 3210 by lifting or rotating the nozzle shaft 3230.

The recovery unit 3300 recovers the substrate cleaning composition supplied to the substrate 'S'. When the substrate cleaning composition is supplied to the substrate 'S' by the nozzle unit 3200, the support unit 3100 may rotate the substrate 'S' to uniformly supply the substrate cleaning composition to the entire area of the substrate 'S'. When the substrate 'S' rotates, the substrate cleaning composition is scattered from the substrate 'S'. The scattered substrate cleaning composition may be recovered by the recovery unit 3300.

The recovery unit 3300 includes a recovery tub 3310, a recovery line 3320, a lifting bar 3330, and a lifting driver 3340.

The recovery tub 3310 is provided in the shape of an annular ring surrounding the support plate 3110. A plurality of recovery tubs 3310 may be provided. The plurality of recovery tubs 3310 may be provided in the shape of rings which are sequentially away from the support plate 3110 when viewed from the top. As the recovery tub 3310 is at a longer distance from the support plate 3110, the recovery tub 3310 has a higher height. A recovery port 3311 is formed in the space between the recovery tubs 3310 such that the substrate cleaning composition scattered from the substrate 'S' is introduced into the recovery port 3311.

The recovery line 3320 is formed on a bottom surface of the recovery tub 3310.

The lifting bar 3330 is connected to the recovery tub 3310. The lifting bar 3330 receives power from the lifting driver 3340 to move the recovery tub 3310 up and down. When a plurality of recovery tubs 3310 are provided, the lifting bar 3330 may be connected to the outermost recovery tub 3310. The lifting driver 3340 moves up and down the recovery tub 3310 through the lifting bar 3330 to adjust the recovery port 3311, which is to introduce the scattered substrate cleaning composition, of a plurality of recovery ports 3311.

According to an embodiment of the inventive concept, the substrate cleaning composition includes an organic solvent, a binder, and an etching compound. The details thereof will be described below with reference to FIG. 3.

Figure 3:
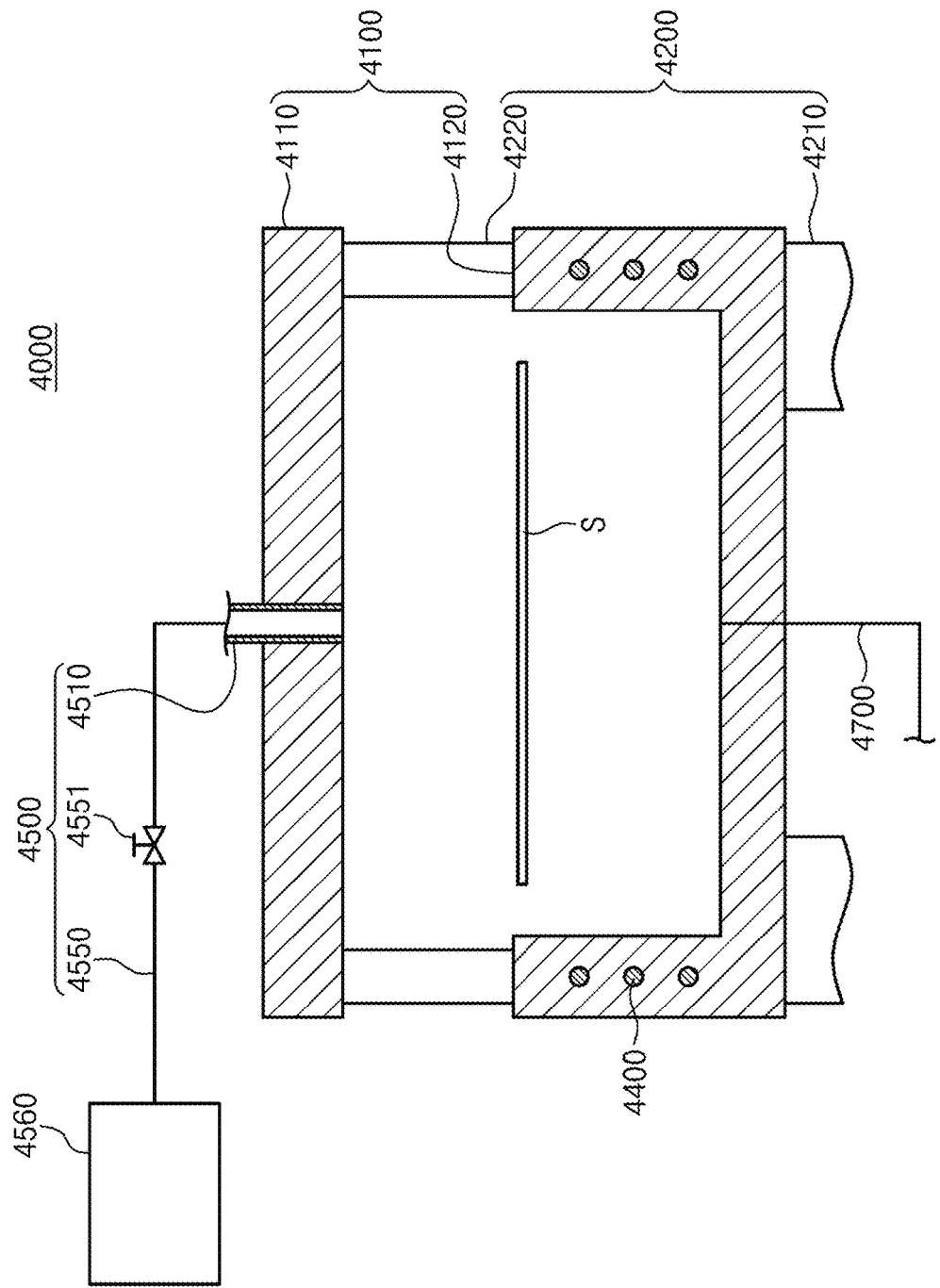
FIG. 3 is a sectional view illustrating a second process chamber of FIG. 1, according to an embodiment.

FIG. 3 is a sectional view illustrating a second process chamber of FIG. 1, according to an embodiment.

Referring to FIG. 3, the second process chamber 4000 includes a chamber 4100, a lifting unit 4200, a support unit (not illustrated), a heating member 4400, a fluid supply unit 4500, a blocking member (not illustrated), and an exhaust member 4700. The second process chamber 4000 performs a substrate treating process using a supercritical fluid.

The chamber 4100 provides a treatment space in which a supercritical process is performed. The chamber 4100 is formed of a material to withstand high pressure which is equal to or greater than critical pressure.

The chamber 4100 includes an upper body 4110 and a lower body 4120. The lower body 4120 is provided under the upper body 4110 while being coupled to the upper body 4110. The space made through the combination of the upper body 4110 and the lower body 4120 is provided as a treatment space for performing the substrate treating process.

The upper body 4110 is fixedly mounted on the external structure. The lower body 4120 is provided to move up and down with respect to the upper body 4110. When the lower body 4120 moves down and is away from the upper body 4110, the treatment space is open inside the second process chamber 4000. The substrate 'S' may be introduced into or withdrawn from an inner space, which serves as the treatment space open, of the second process chamber 4000.

When the lower body 4120 moves up and makes close contact with the upper body 4110, the treatment space inside the second process chamber 4000 is closed. In the closed treatment space, the substrate 'S' may be treated using the supercritical fluid. Alternatively, the chamber 4100 may be provided in the structure in which the lower body 4120 is fixedly mounted and the upper body 4110 moves down.

The lifting unit 4200 lifts the lower body 4120. The lifting unit 4200 includes a lifting cylinder 4210 and a lifting rod 4220. The lifting cylinder 4210 is coupled to the lower body 4120 to generate driving force in a vertical direction. The lifting cylinder 4210 generates the driving force to the extent of overcoming high pressure equal to or greater than critical pressure inside the second process chamber 4000 and of bringing the lower body 4120 into contact the upper body 4110 to close the second process chamber 4000, while performing substrate treatment using the supercritical fluid. The lifting rod 4220 has one end inserted in to the lifting cylinder 4210 to extend in the vertical direction such that an opposite end of the lifting rod 4220 is coupled to the upper body 4110. When the driving force is generated from the lifting cylinder 4210, the lifting cylinder 4210 and the lifting rod 4220 relatively move up such that the lower body 4120 coupled to the lifting cylinder 4210 moves up. While the lower body 4120 moves up and down by the lifting cylinder 4210, the lifting rod 4220 prevents the upper body 4110 and the lower body 4120 from moving in the horizontal direction, guides moving-up and moving-down directions, and prevents the upper body 4110 and the lower body 4120 from deviating from the correct positions.

The support unit (not illustrated) is positioned in the treatment space of the chamber 4100 to support the substrate 'S'. The support unit (not illustrated) is coupled to the upper body 4110 or the lower body 4220.

The support unit (not illustrates) makes contact with an edge area of the substrate 'S' to support the substrate 'S'. The supported substrate 'S' may be treated using the supercritical fluid with respect to an entire top surface thereof and a most part of the bottom surface thereof. In this case, the substrate 'S' may have a patterned top surface and a non-patterned bottom surface.

The heating member 4400 heats the inside of the second process chamber 4000. The heating member 4400 heats the supercritical fluid, which is supplied into the second process chamber 4000, to a critical temperature or higher such that the supercritical fluid is maintained to be in a supercritical fluid phase. The heating member 4400 may heat the supercritical fluid, which is liquefied, to become a supercritical fluid again. The heating member 4400 is buried and installed in at least one of the upper body 4110 and the lower body 4120. The heating member 4400 receives power from the outside to generate heat. For example, the heating member 4400 may include a heater.

The fluid supply unit 4500 supplies fluid to the second process chamber 4000. The fluid supplied may be the supercritical fluid. For example, the supercritical fluid supplied may include carbon dioxide. In addition, the fluid supply unit 4500 may supply the mixture of the supercritical fluid and the substrate cleaning composition.

The fluid supply unit 4500 includes a fluid supply port 4510, a supply line 4550, and a valve 4551.

The fluid supply port 4510 is to directly supply the supercritical fluid to the top surface of the substrate 'S'. The fluid supply port 4510 is provided to be connected to the upper body 4110. The fluid supply port 4510 may further include a lower fluid supply port (not illustrated) connected to the lower body 4120. The supercritical fluid sprayed from the fluid supply port 4510 reaches the central area of the substrate 'S' and is spread to the edge area of the substrate 'S' while being uniformly provided to the whole area of the substrate 'S'.

The supply line 4550 is connected to the fluid supply port 4510. The supply line 4550 receives the supercritical fluid from a separate supercritical fluid storage unit 4560, which is placed outside, to supply the supercritical fluid to the fluid supply port 4510. For example, the supercritical fluid storage unit 4560 stores a supercritical fluid, which may be carbon dioxide, and supplies the supercritical fluid to the supply line 4550.

The valve 4551 is mounted on the supply line 4550. A plurality of valves 4551 may be provided on the supply line 4550. The valves 4551 regulate an amount of the supercritical fluid supplied to the fluid supply port 4510. The valve 4551 may control an amount of a fluid supplied to the chamber 4100 by a controller 5000.

A blocking member (not illustrated) prevents the supercritical fluid, which is supplied from the fluid supply unit 4500, from directly being sprayed to the substrate 'S'. The blocking member (not illustrated) is positioned in the treatment space inside the chamber 4100. The blocking member (not illustrated) is interposed between the support unit (not illustrated) and the fluid supply port 4510. The blocking member (not illustrated) may be provided in the shape of a circular plate.

The exhaust member 4700 exhausts the supercritical fluid from the second process chamber 4000. The exhaust member 4700 may be connected to an exhaust line 4750 (not illustrated) that exhausts the supercritical fluid. In this case, a valve (not illustrated) for regulating an amount of the supercritical fluid exhausted to the exhaust line 4750 may be mounted on the exhaust member 4700. The supercritical fluid exhausted through the exhaust line 4750 may be discharged into the atmosphere or supplied to a supercritical fluid regeneration system (not illustrated). The exhaust member 4700 may be coupled to the lower body 4120.

The supercritical fluid may be exhausted from the second process chamber 4000, and the internal pressure of the supercritical fluid is reduced to be critical pressure or less such that the supercritical fluid is liquefied, at the later stage of the substrate treating process using the supercritical fluid. The liquefied supercritical fluid may be discharged through the exhaust member 4700, which is formed in the lower body 4120, by gravity.

Figure 4:
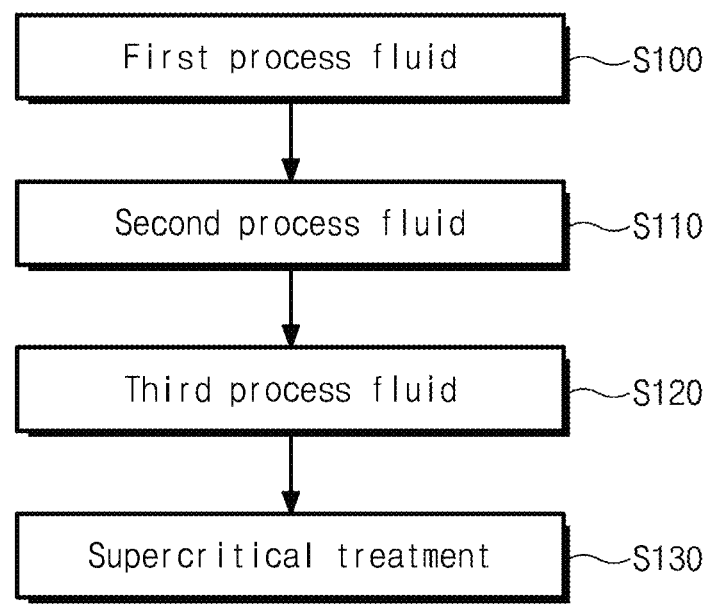
FIG. 4 is a view illustrating a procedure of treating a substrate, according to an embodiment.

FIG. 4 is a view illustrating a procedure of treating a substrate, according to an embodiment.

Referring to FIG. 4, the substrate processing apparatus 100 treats the substrate 'S' which is coated with the developer and introduced, according to a setting process. The substrate 'S' is provided in the state of being coated with a developer matched with a positive photoresist after coated with a positive photoresist and exposed. For example, the developer coated onto the substrate 'S' may be tetramethylammonium hydroxide (TMAH).

A first process fluid is supplied to the substrate 'S' (S100). The first process fluid may rinse the substrate 'S' coated with the developer. The first process fluid may be pure water.

Thereafter, a second process fluid is supplied to the substrate 'S' (S110). The second process fluid is provided with a mixture of a hydrophobic organic solvent and a surfactant. It is preferable that the hydrophobic organic solvent is provided as a non-polar solvent. The hydrophobic organic solvent may be any one of hexane, heptane, and Petroleum Ether (PET). As the second process fluid contains the surfactant, the first process fluid having a hydrophilic property and coated on to the substrate 'S' is smoothly replaced with a second process fluid containing a hydrophobic organic solvent.

The surfactant is selected as having a Hydropilic-Lipophilic Balance in the range of 6 to 9. In one embodiment, the surfactant is a nonionic surfactant. In one embodiment, the surfactant includes a sorbitan ester (Sorbitan Esters or Spans). The sorbitan ester may be any one of Sorbitan trioleate (Span 85), Sorbitan monooleate (Span 80), and Sorbitan monolaurate (Span 20). Preferably, the surfactant is Sorbitan trioleate (Span 85).

Figure 5A:
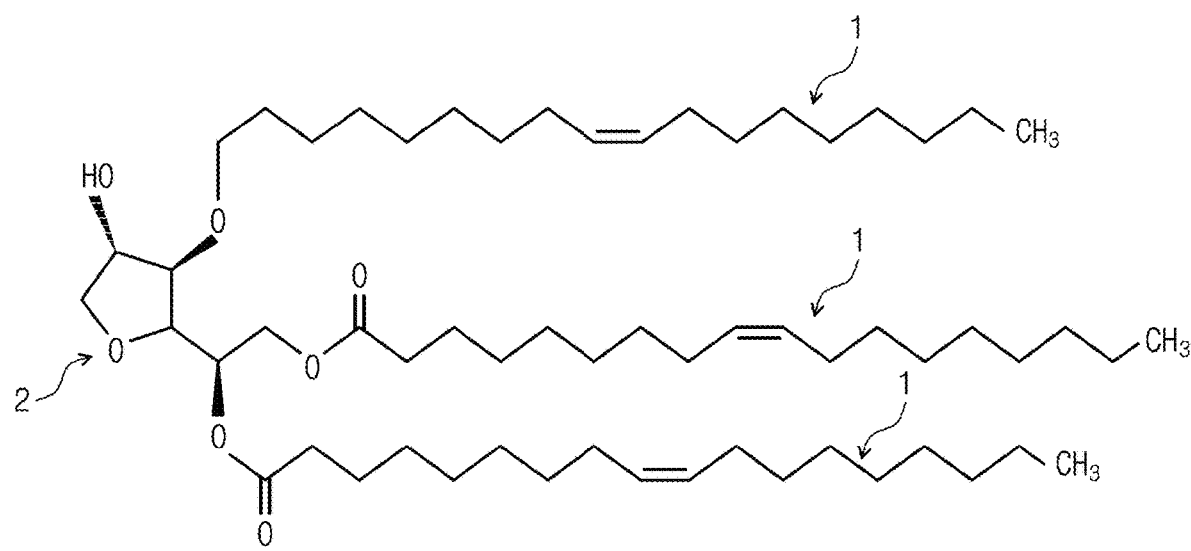
FIG. 5A shows the formula of Span85 (Sorbitan trioleate)
Figure 5B:
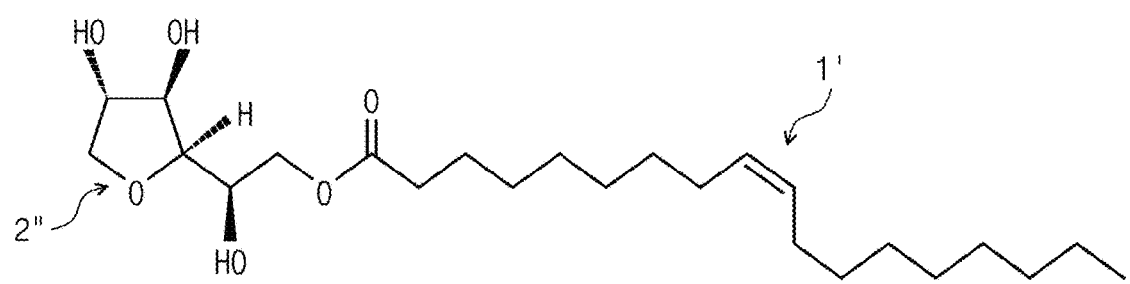
FIG. 5B shows the formula of Span80 (Sorbitan monooleate)
Figure 5C:
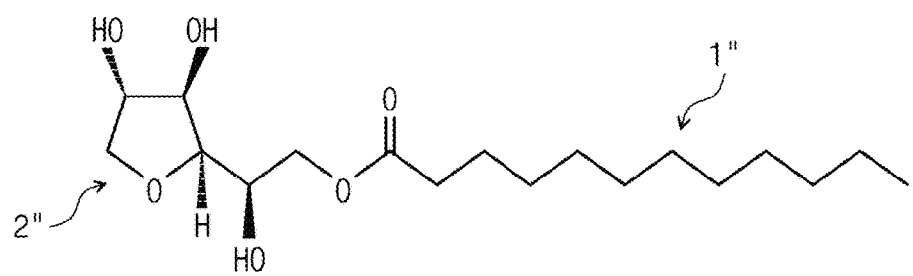
FIG. 5C shows the formula of Span20 (Sorbitan monolaurate).

FIG. 5A shows the formula of Span85 (Sorbitan trioleate), FIG. 5B shows the formula of Span80 (Sorbitan monooleate), and FIG. 5C shows the formula of Span20 (Sorbitan monolaurate). According to the detection of the present inventors, since the length of a tail 1, which is a lipohphile of Span 85, is longer than tail 1' of Span 80 and tail 1" of Span 20. Or the number of tails 1 is larger than the number of tail 1' of Span 80 and the number of tail 1" of Span 20, even though water substitution of Span 85 is lower than those of Span80 and Span 20, Span 85 represents higher substitution with the third process fluid to be supplied thereafter and even represents higher substitution with the supercritical fluid. The present inventors founded out that 90% of more of Leaning Free is caused when a mixture of heptane and Span85 is used as the second process fluid.

Referring back to FIG. 4, hereafter, a third process fluid is supplied to the substrate 'S' (S120). The third process fluid is provided with a hydrophobic organic solvent. The hydrophobic organic solvent may be any one of hexane, heptane, and petroleum ether (PET). The third process fluid may be subsequently supplied after the second process fluid is supplied. For example, the switching from supplying the second process fluid to supplying the third process fluid may be performed to block the surfactant mixed with the hydrophobic organic solvent in the process of supplying the hydrophobic organic solvent containing the surfactant. In this case, the mixture of the surfactant with a set amount of hydrophobic organic solvent is supplied and supplying the mixture is intermittently stopped. In addition, an amount of the surfactant contained in the hydrophobic organic solvent may be reduced while the second process fluid is being supplied. In addition, the supplying of the second process fluid and the supplying of the third process fluid may be intermittently performed.

The first process fluid to the third process fluid may be coated in the first process chamber 3000.

Thereafter, the substrate 'S' is introduced into the second process chamber 4000 in the state that the third process fluid remains on the substrate 'S'. When the substrate 'S' is introduced, the second process chamber 4000 removes the third fluid from the substrate 'S' by supplying the supercritical fluid (S130).

According to the inventive concept, the substrate 'S' coated with the developer is treated using the supercritical fluid to prevent the pattern from being collapsed in the process of treating and drying the substrate 'S' after coating the developer. In addition, a hydrophilic organic solvent, such as isopropyl alcohol (IPA), causes damage to photoresist for forming the pattern in the process of reacting with the supercritical fluid. To the contrary, according to the inventive concept, when the substrate 'S' is exposed to the supercritical fluid, the hydrophilic organic solvent is absent to prevent the pattern from being damaged.

According to another embodiment, after the first process fluid is supplied, the second process fluid supplied to the substrate 'S' may be the hydrophilic organic solvent. For example, the hydrophilic organic solvent may include IPA. As the second process fluid is provided as the hydrophilic organic solvent, the second process fluid may be effectively substituted with the first process fluid coated on the substrate 'S'.

Thereafter, similarly, after supplying the third process fluid serving as the hydrophilic organic solvent, the resultant is dried using the supercritical fluid. Similarly to the second process fluid, the third process fluid serves as the organic solvent to be effectively substituted with the second process fluid.

According to an embodiment of the inventive concept, there may provide a substrate treating apparatus and a substrate treating method, capable of effectively treating a substrate.

In addition, according to an embodiment of the inventive concept, there may provide a substrate treating apparatus and a substrate treating method, capable of preventing the pattern from being damaged in the process of treating the substrate coated with the developer.

The effects produced in the inventive concept are not limited to the aforementioned effects, and any other effects not mentioned herein will be clearly understood from the detailed description and accompanying drawings by those skilled in the art to which the inventive concept pertains.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

What is claimed is:

1. An apparatus for treating a substrate, the apparatus comprising:
   a first process chamber to apply an organic solvent to a substrate applied with a developer and introduced; and
   a second process chamber to treat the substrate applied with the organic solvent and introduced, through a supercritical fluid,
   wherein the organic solvent further includes a surfactant, and
   wherein the surfactant is a sorbitan ester that has more tails than sorbitan monooleate (Span80) or has a tail having a length longer than a length of a tail of sorbitan monooleate (Span80).

2. The apparatus of claim 1, wherein a first process fluid, which is pure water, is applied to the substrate before applying the organic solvent in the first process chamber.

3. The apparatus of claim 2, wherein the organic solvent includes:
   a second process solvent applied to the substrate after applying the pure water; and
   a third process fluid applied to the substrate after applying the second process solvent.

4. The apparatus of claim 3, wherein the second process solvent is provided with a non-polar solvent.

5. The apparatus of claim 3, wherein the second process solvent and the third process fluid are provided with hydrophobic organic solvents.

6. The apparatus of claim 1, wherein the surfactant has a Hydropilic-Lipophilic Balance in a range of 6 to 9.

7. The apparatus of claim 1, wherein the sorbitan ester sorbitan trioleate (Span 85).

8. The apparatus of claim 1, wherein the developer is used to develop a positive photoresist.

9. An apparatus for treating a substrate, the apparatus comprising:
   a first process chamber;
   a second process chamber;
   a transfer robot provided between the first process chamber and the second process chamber to carry the substrate to the first process chamber or the second process chamber; and
   a controller,
   wherein the first process chamber includes:
   a support unit to support and rotate the substrate; and
   a nozzle unit including a nozzle to supply at least one of an organic solvent and pure water to the substrate supported by the support unit,
   wherein the second process chamber includes:
   a chamber to provide a treatment space for performing a supercritical process; and
   a fluid supply unit to supply a supercritical fluid to the treatment space of the chamber, and
   wherein the controller is configured to:
   control the support unit and the nozzle unit with respect to a substrate applied with a developer in the first process chamber to supply the organic solvent to the substrate in a state that the substrate is rotated;
   control the transfer robot to transfer the substrate, which is applied with the organic solvent, to the second process chamber; and perform a control operation to treat the substrate applied with the organic solvent through the supercritical fluid, in the second process chamber, wherein the organic solvent further includes a surfactant, and wherein the surfactant is a sorbitan ester that has more tails than sorbitan monooleate (Span80) or has a tail having a length longer than a length of a tail of sorbitan monooleate (Span80).

10. The apparatus of claim 9, wherein the pure water is applied to the substrate before applying the organic solvent in the first process chamber.

11. The apparatus of claim 10, wherein the organic solvent includes:

a second process solvent applied to the substrate after applying the pure water; and a third process fluid applied to the substrate after applying the second process solvent.

12. The apparatus of claim 11, wherein the second process solvent and the third process fluid are provided with hydrophobic organic solvents.

13. The apparatus of claim 12, wherein the first and second process solvent and the third process fluid include heptane or petroleum ether.

14. The apparatus of claim 9, wherein the surfactant has a Hydropilic-Lipophilic Balance in a range of 6 to 9.

* * * * *